United States Patent
Sugasawara et al.

(10) Patent No.: US 6,239,609 B1
(45) Date of Patent: *May 29, 2001

(54) REDUCED VOLTAGE QUIESCENT CURRENT TEST METHODOLOGY FOR INTEGRATED CIRCUITS

(75) Inventors: Emery O. Sugasawara, Pleasanton; Ronnie V. Vasishta, Mountain View; Victer K. Chan, San Jose, all of CA (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/022,353

(22) Filed: Feb. 11, 1998

(51) Int. Cl.[7] .................................................. G01R 31/26

(52) U.S. Cl. ............................................ 324/769; 324/765

(58) Field of Search ................................... 324/522, 523, 324/765, 766, 769, 719

(56) References Cited

U.S. PATENT DOCUMENTS

| | | | |
|---|---|---|---|
| 5,332,973 | * 7/1994 | Brown et al. | 324/537 |
| 5,519,333 | * 5/1996 | Righter | 324/765 |
| 5,532,174 | 7/1996 | Corrigan | 437/8 |
| 5,644,251 | 7/1997 | Colwell et al. | 326/16 |
| 5,652,524 | * 7/1997 | Jennion et al. | 324/765 |
| 5,670,890 | 9/1997 | Colwell et al. | 326/16 |
| 5,742,177 | * 4/1998 | Kalb, Jr. | 324/765 |
| 5,751,141 | * 5/1998 | Sachdev et al. | 324/537 X |
| 5,889,408 | * 3/1999 | Miller | 324/765 |
| 5,889,409 | * 3/1999 | Kalb, Jr. | 324/765 |
| 5,986,461 | * 11/1999 | Kalb, Jr. | 324/765 |

OTHER PUBLICATIONS

IBM Microelectronics, *Defect Localization—Fault Isolation*, at http://www.chips.ibm.com/services/asg/capabilities/asweb07.html, 10 pages (Date Unavailable).

IBM Microelectronics, *Enhance VLSI functional failure analysis with IDDQ current measurements*, at http://www-.chips.ibm.com/services/asg/appnotes/app01.html, 3 pages (Date Unavailable).

\* cited by examiner

*Primary Examiner*—Glenn W. Brown

(57) ABSTRACT

A method for improving the accuracy of quiescent current testing by reducing reliance on absolute quiescent current test limits. Initially, the device under test is placed into a static DC state in a traditional manner. Quiescent current is then measured with the power supply to the device set to a nominal operating voltage. Next, a fixed voltage lower than the nominal power supply voltage is applied to the integrated circuit in order to reduce the quiescent current consumed by the device. An additional quiescent current measurement is taken. The difference in quiescent current between the first and second measurements is then calculated. Additional quiescent current measurement(s) are also taken at increasing lower supply voltages. The differences in quiescent currents between each of these measurements is also calculated. After a sufficient number of measurements have been gathered, the resulting difference values are examined to determine the "linearity" of the quiescent current reduction. In an acceptable device, the lower power supply voltages cause the leakage or quiescent current inherent in the integrated circuit to decrease in a roughly exponential manner. Therefore, if the reduction in quiescent current is roughly exponential, it is generally assumed that the detected quiescent currents are a result of normal transistor effects. If the change in currents approximates a linear function, however, it is likely that the device under test contains a defect and the device is rejected.

19 Claims, 3 Drawing Sheets

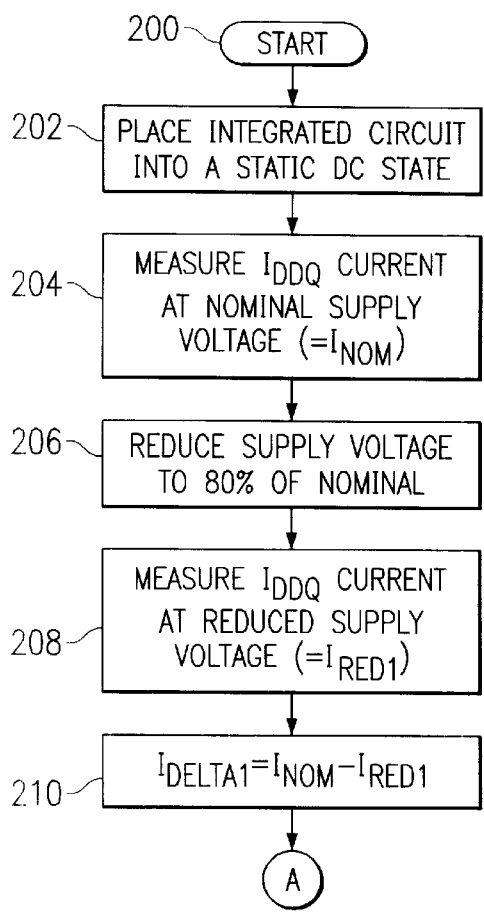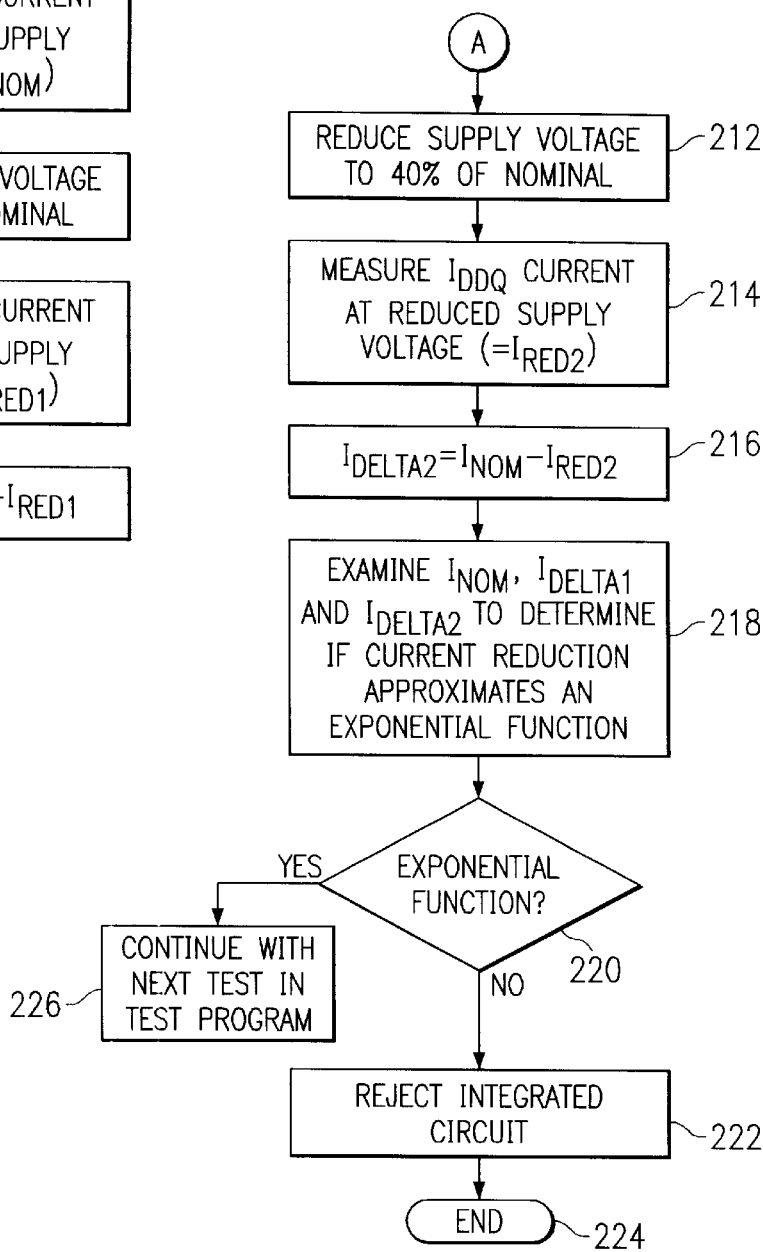

REDUCED VOLTAGE QUIESCENT CURRENT TEST METHODOLOGY FOR INTEGRATED CIRCUITS

BACKGROUND OF THE INVENTION

1. Field of the Invention

The invention relates to testing of semiconductor devices, and more particularly to a method for reducing transistor leakage currents in integrated circuits to improve the accuracy of quiescent current testing.

2. Description of the Related Art

Integrated circuits (ICs) have become key components of many consumer and commercial electronic products, often replacing discrete components and enhancing product functionality. The semiconductor processing technologies that produce these integrated circuits have advanced to the point where complete systems can often be reduced to a single integrated circuit. These integrated circuits (also referred to as "chips") may use many functions that previously could not be implemented together on a single chip, including: microprocessors, digital signal processors, mixed signal and analog functions, large blocks of memory and high speed interfaces. It is a common practice for the manufacturers of such integrated circuits to thoroughly test device functionality at the manufacturing site. However, the complex nature of today's integrated circuits presents new testing challenges. Continually shrinking device geometries, coupled with the high cost of operating semiconductor processing equipment, result in increased demands on integrated circuit suppliers to improve process yields and develop new test strategies.

Currently, complementary metal-oxide-semiconductor (CMOS) is the most popular technology for fabricating integrated circuits due to its inherent low power consumption in high density designs. CMOS circuits use complementary p-channel metal-oxide-semiconductor field-effect (PMOS) transistors and n-channel metal-oxide-semiconductor field-effect (NMOS) transistors to produce fully static designs that ideally consume no power except when switching states. In practice, however, CMOS circuits draw low leakage or quiescent currents—also referred to as quiescent power supply current or IDDQ—in a static state. Testing the amount of quiescent current consumed by an integrated circuit provides a relatively simple and cost effective test strategy for screening for physical defects, many of which cause a measurable increase in quiescent current consumption.

The main goal of semiconductor test strategies is to screen out devices having functional or physical defects, while establishing test limits that do not reject good devices. Many test development strategies have evolved, and often combinations of these strategies are utilized to provide a high degree of fault coverage. Test development strategies include functional tests wherein automatic test equipment (ATE) test programs are performed in which the circuit under test is stimulated with specified inputs while the outputs are monitored to determine if they correspond with simulated logic values. Structural tests are also utilized and rely on a model of logical circuit faults. These tests are often implemented using "boundary scan" or "full scan" circuitry in conjunction with structural test sets. Structural tests sometimes begin with functional logic simulations that have been fault graded and enhanced for higher fault coverage.

Another test development strategy, physical defect testing, involves creating specific tests designed to detect possible real physical defects that can occur in a circuit. Physical testing is useful for detecting defects that may not cause the device to fail functional or structural testing, but may lead to failure in the field. Defects in integrated circuits take many forms, some of which are test pattern sensitive. Gate oxide defects, drain to source current leaks (punch-through), and p-n junction current leaks (such as drain or source to diffusion current leaks) tend to be pattern sensitive, while resistive shorts to ground or the power supply voltage are usually pattern insensitive. In either case, quiescent current tests are a valuable tool in detecting faults.

Generally, the result of test development is an ATE test program or test "set" providing stimulus/response test "vectors" in the language of the ATE. The ATE test set causes the inputs of the device under test to be driven in a predetermined manner, while output pin voltages are compared to stored test values. The ATE test set is derived mainly from functional and structural test development logic simulations.

When testing quiescent current with a functional test set, the tester is typically halted at predetermined test steps suitable for quiescent current testing. Once halted (i.e., no transistor state switching is occurring) the power supply or quiescent current of the device under test is measured by the ATE and the resulting value is compared to predetermined reference values or test limits. Such quiescent current tests are effective in detecting many faults not recognized by other test strategies.

For example, with most functional tests that measure voltage, faults must propagate to the output pins of the device under test for the ATE to differentiate between a good or bad device. Quiescent current tests differ in that current is sensed rather than voltage, providing a simple means to monitor the entire circuit or portions thereof for overcurrent conditions. The quiescent current measurements are typically accomplished via the tester's parametric unit.

Accurate quiescent current testing requires that the device under test be in a static DC condition, with any circuitry that draws current in the static DC condition being disabled or accounted for in the test limits. Preferably analog circuitry, input/output pads, and other circuitry not conducive to quiescent current testing are provided with separate, dedicated power supply inputs, so that digital core circuitry can be tested separately.

Although quiescent current testing is performed by the majority of semiconductor manufacturers, no standardized method exists for selecting the quiescent current reference values or limits that determine whether a device passes or fails the test. Test limits are often quite loose and sometimes established on an arbitrary basis, frequently ranging between ten microamps to over one milliamp. One method for setting test limits involves simply estimating the number of transistors in a device and multiplying by a conversion factor. In another method, representative devices are sampled to arrive at acceptable threshold limits. All of these prior methods for establishing quiescent current test limits suffer from inherent inaccuracies. If the quiescent current test limits are set too low, good devices may be rejected. If the quiescent current test limits are set too high, faulty devices may escape detection. Presently, no significant attempt is made to minimize the effects of inherent and expected quiescent currents other than placing the device under test in a static DC state.

SUMMARY OF THE INVENTION

Briefly, the present invention provides a method for improving the accuracy of quiescent current testing by reducing the effects of inherent transistor leakage currents. Quiescent current tests are performed at a number of different supply voltages, with the acceptability of the device under test being partially dependent on the non-linearity of the resulting measurements, thereby minimizing reliance on absolute quiescent current test limits.

Initially, the device under test is placed into a static DC state in a traditional manner. Quiescent current is then measured with the power supply to the device set to a nominal operating voltage. Next, a fixed voltage lower than the nominal power supply voltage is applied to the integrated circuit in order to reduce the quiescent current consumed by its transistors. An additional quiescent current measurement is then taken.

The difference in quiescent current between the first and second measurements is then calculated. Additional quiescent current measurement(s) are also taken at increasingly lower supply voltages. The differences in quiescent currents between each of these measurements are calculated. After a sufficient number of measurements has been gathered, the resulting difference values are examined to determine the "linearity" of the quiescent current reduction. In an acceptable device, the lower power supply voltages cause the leakage or quiescent current inherent in the integrated circuit to decrease in a roughly exponential manner. Therefore, if the reduction in quiescent current is roughly exponential, it is generally assumed that the detected quiescent currents are a result of normal transistor effects. If the change in currents approximates a linear function, however, it is likely that the device under test contains a defect and the device is rejected. The invention thereby permits quiescent testing to focus on the response of the device to changes in power supply voltage rather than rigid test limits.

BRIEF DESCRIPTION OF THE DRAWINGS

A better understanding of the present invention can be obtained when the following detailed description of the preferred embodiment is considered in conjunction with the following drawings, in which:

FIGS. 2A and 2B are flow diagram representations of a method according to the present invention for reducing transistor leakage current in an integrated circuit to improve the accuracy of quiescent current testing;

DETAILED DESCRIPTION OF THE PREFERRED EMBODIMENT

Figure 1A:
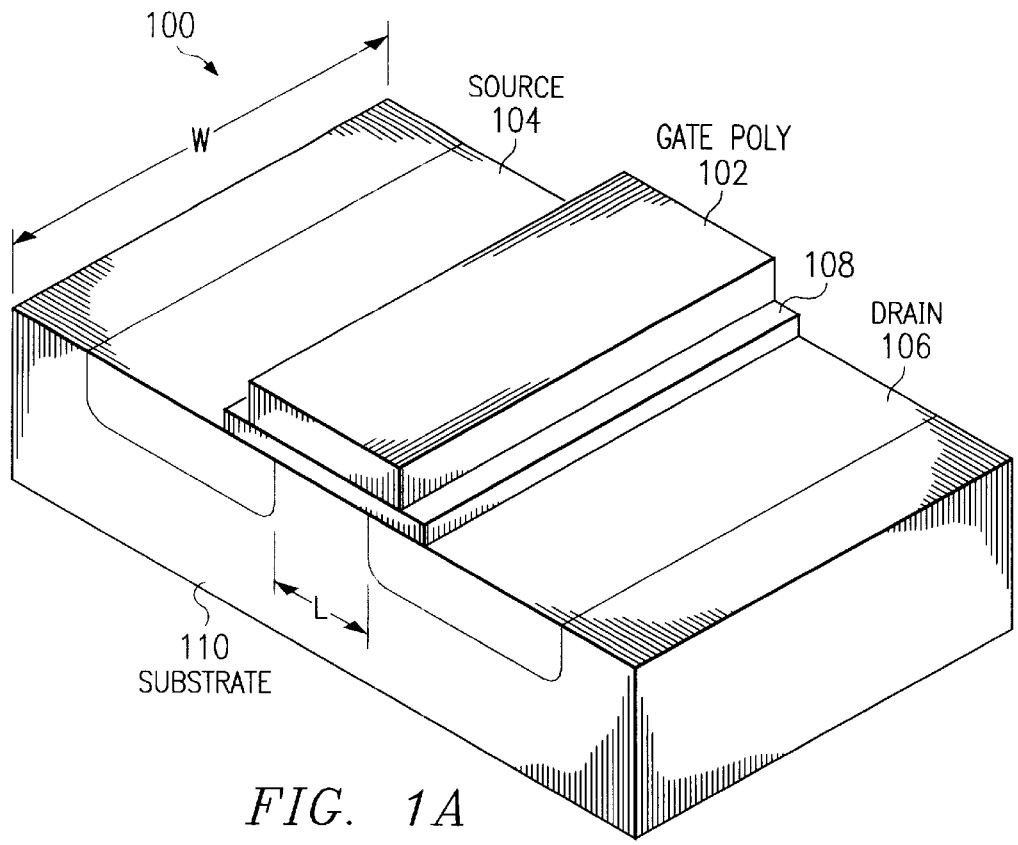
FIGS. 1A and 1B are cross-sectional and top views, respectively, of a typical metal-oxide-semiconductor integrated transistor.

Turning now to the drawings, FIG. 1A shows a cross-sectional view of a generic metal-oxide-semiconductor (MOS) integrated transistor 100. In a typical integrated circuit, hundreds of thousands or even millions of such transistors are connected to form digital circuitry. An integrated transistor 100 is typically built on the surface of a silicon substrate 110 by interconnecting sections of materials in three primary layers: a conducting layer of metal (not shown) used for electrical connection; and two layers of semiconductors—polysilicon or poly 102 and diffusion regions (shown as source diffusion region 104 and drain diffusion region 106). The semiconductor layers are normally isolated from each other by insulating material such as silicon dioxide (or gate oxide) 108. The diffusion regions 104 and 106 can be of n-type, meaning that electrons carrying a negative charge are available to support electrical conduction in a voltage gradient, or of p-type, if holes carrying positive charges are used to support electrical conduction. To enhance the availability of charge carriers, the semiconductors can be implanted with additional charge carrying ions. When a polysilicon layer 102 overlays (on two opposing sides) two diffusion regions 104 and 106, a transistor is formed.

There are two basic types of MOS transistors: the n-channel and p-channel. In an n-channel MOS (NMOS) transistor, two n-type diffusions regions 104 and 106 are embedded in a p-type substrate 110 and connected via metal or other conducting material to form the source and drain of the transistor 100. On the surface of the substrate 110, the thin layer of silicon dioxide material 108 is formed. The polysilicon layer 102 is then deposited on top of the silicon dioxide material 108 to form the gate of the transistor 100. Alternatively, if the substrate 110 is n-type and the diffusion regions 104 and 106 are p-type, a p-channel MOS (PMOS) transistor is formed. In addition to a CMOS process, it is contemplated that the present invention could find use with other types of semiconductor process, such as gallium arsenide or bipolar processes. It will be appreciated by those of skill in the art that the amount of quiescent current and its response to changes in supply voltage may vary significantly in such processes, however, as certain types of transistors consume relatively significant current even in a "static" state.

Figure 1B:
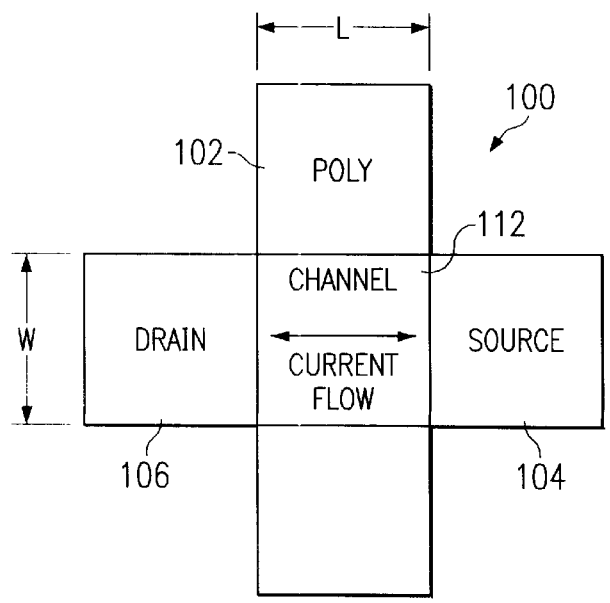

Referring now to FIG. 1B, a simplified top views of the polysilicon layer 102, channel region 112 and diffusion regions 104 and 106 of the transistor 100 are shown. The channel region 112 is defined to be the region under the polysilicon layer 102 between the source diffusion region 104 and drain diffusion region 106. During normal operation, current flow through the transistor 100 is between the drain diffusion region 106 and source diffusion region 104. The magnitude of the current is determined by the voltage differential between the drain diffusion region 106 and the source diffusion region 104 as well as the voltage differential (or "gate voltage") between the gate/polysilicon layer 102 and source diffusion region 104 of the transistor 100, which generally must exceed a minimum value referred to as the threshold voltage. Electrical operation of the transistor 100 is well known to those skilled in the art. In FIGS. 1A and 1B, L and W denote the length and width, respectively, of the portion of the polysilicon layer 102 overlapping the channel region 112.

Of note in the present invention, leakage or quiescent current also flows between the drain diffusion region 106 and the source diffusion region 104, even when the gate voltage does not exceed the threshold voltage of the transistor 100. As depicted graphically in FIG. 3, the magnitude of the quiescent current in a typical transistor 100 decreases exponentially with respect to the voltage differential between the drain diffusion region 106 and the source diffusion region 104. Quiescent current in a typical CMOS transistor can be approximated by the equation: $I=I_{linear}e^{-[kt/q-1]}$. As appreciated by those skilled in the art, the voltage differential between the drain diffusion region 106 and the source diffusion region 104 is typically the power supply voltage to the integrated circuit when the transistor 100 is in a non-conductive state (i.e., only leakage current is present).

Referring now to FIGS. 2A and 2B, a method according to the present invention for reducing transistor leakage current in an integrated circuit to improve the accuracy of quiescent current testing is illustrated. Following commencement of the routine in step 200 (FIG. 2A), control proceeds to step 202 and the integrated circuit is placed in a static DC state. In the static DC state, all of the circuitry under test is preferably placed in a known state such that no transistor switching is occurring and no transistor gate voltages are floating (i.e., no transistors are drawing current other than static leakage current). After the integrated circuit has been conditioned to a static DC state, the testing process proceeds to step 204 and quiescent current is measured at a nominal supply voltage. The quiescent current measure at this supply voltage is denoted as $I_{NOM}$.

The testing process continues in step 206 where the supply voltage to the circuitry under test is reduced to 80% of its nominal value. Next, an additional quiescent current measurement is taken at the reduced supply voltage in step 208. This additional quiescent current measurement, denoted as $I_{RED1}$, will in almost all cases be less than $I_{NOM}$. Control next proceeds to step 210 and a delta current $I_{DELTA1}$ value is calculated by subtracting $I_{RED1}$ from $I_{NOM}$.

The process then continues with step 212 (FIG. 2B) where the supply voltage is further reduced to 40% of the nominal value used in step 204. Control then proceeds to step 214 and quiescent current value $I_{RED2}$ is measured at the reduced supply voltage of step 212. Next, in step 216, a second delta current value $I_{DELTA2}$ is calculated by subtracting $I_{RED2}$ from $I_{NOM}$.

In step 218, the current values $I_{NOM}$, $I_{DELTA1}$, and $I_{DELTA2}$ are examined to determine if the current reduction measured in steps 204, 208, and 214 approximate an exponential function. This determination can be performed by curve-fitting software routines executed by automated test equipment, or any of number of other numerical processes. Exemplary testing equipment on which the invention may be performed include testers produced by Credence Systems Corporation or the ITS 9000 family of testers by Schlumberger Limited.

The calculated values $I_{DELTA1}$, and $I_{DELTA2}$ allow the statistical curve-fitting to be performed without reliance on the absolute values of quiescent current at the various test points. After performing a linear fit of the test points, the "goodness" of the fit to an exponential curve can be calculated. For example, the goodness of the fit may be represented by statistical term "r" as known to those skilled in the art. If $r^2$ has a value less than a predetermined value (e.g., 0.85) for a given device, the device may be designated as likely to include a defect.

As mentioned above, quiescent current in an ideal transistor 100 decreases exponentially with the linear decrease in supply voltage. In contrast, most manufacturing defects which are observable via quiescent current testing result in a linear decrease in measured current when the supply voltage is decreased. Thus, if the reduction in the measured quiescent currents approximates an exponential function, it is assumed in a method according to the present invention it is determined that the integrated circuit under test is free of such manufacturing defects. Control then proceeds to step 224 for execution of subsequent test patterns in the comprehensive test program.

If the reduction in measured quiescent currents does not approximate an exponential function as determined in step 214, control proceeds to step 220 and the integrated circuit under test is rejected. The testing procedure for this integrated circuit then proceeds to step 222.

As will be appreciated by those skilled in the art, many variations are possible to the test methodology of FIGS. 2A and 2B. For example, the test may incorporate a greater number of sample points at a wide variety of supply voltages in order to improve accuracy. The precise values for or number of power supply voltages used during testing are not considered critical to the invention.

Figure 3:
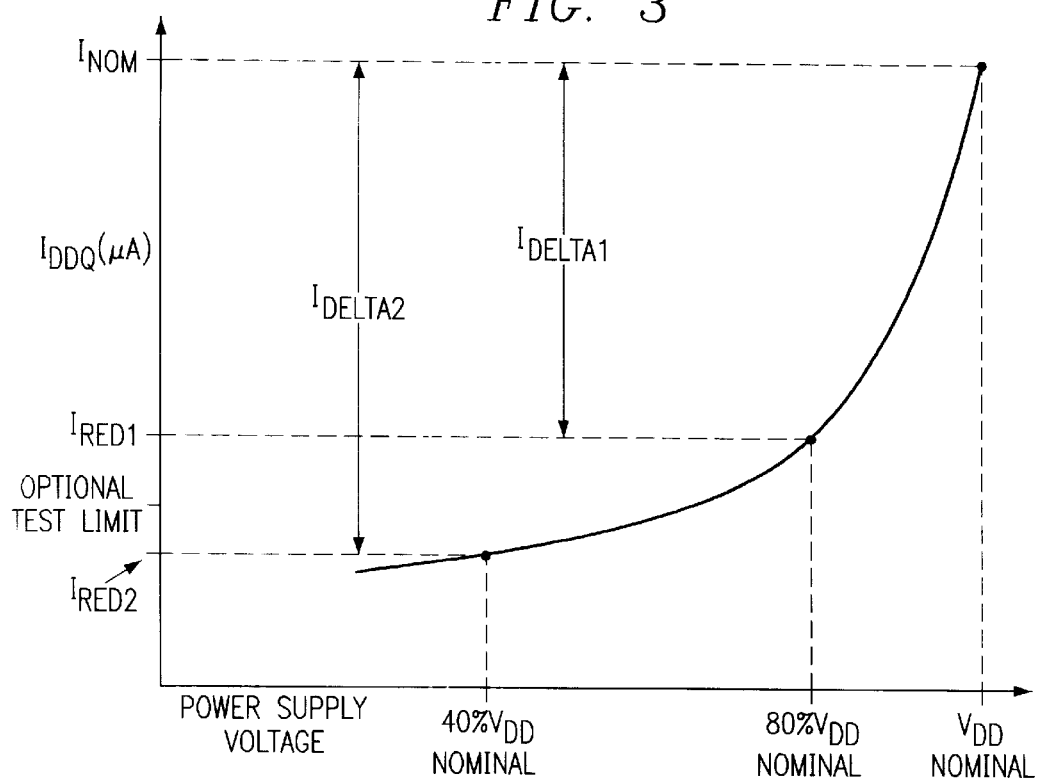
FIG. 3 is a graphical illustration of exemplary quiescent current measurements in an acceptable integrated circuit.

Referring now to FIG. 3, a graphical illustration of exemplary quiescent current measurements in an acceptable integrated circuit is depicted. The values $I_{NOM}$, $I_{RED1}$, and $I_{RED2}$, are plotted on a graph having the power supply voltage as the x-axis and the quiescent current (IDDQ) as the y-axis. As can be seen, in an integrated circuit without significant defects, the plotted values of the I-V curve approximate an exponential function.

Figure 4:
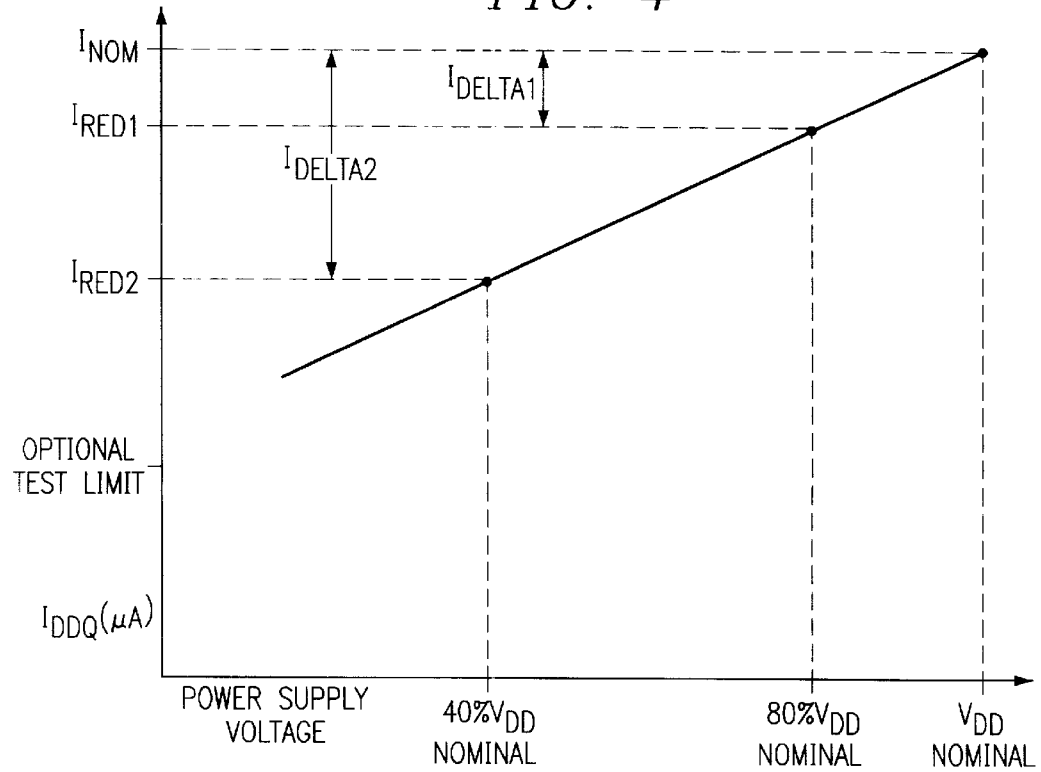
FIG. 4 is a graphical illustration of exemplary quiescent current measurements in an integrated circuit having a defect.

Conversely, FIG. 4 is a graphical illustration of exemplary quiescent current measurements in an integrated circuit having a defect. Instead of an exponential function, the plotted values approximate a linear function for most types of defects detectable via quiescent current testing. Many of these defects can be viewed as resistive in nature, such that decreases in supply voltage produce a roughly linear decrease in measured current.

In addition to basing device acceptability on the shape of an I-V curve, optional predetermined test limit(s) can be incorporated into the test methodology to provide a threshold determination of acceptability. Alternatively, a range of predetermined test limits could be utilized to reflect variations in quiescent current due to differing testing conditions, supply voltages and temperatures. The predetermined test limit(s) can be determined during characterization of the process used to fabricate the integrated circuit under examination. In addition, if analog circuitry is powered by the same power supply pin(s) as the circuitry under examination by the method of FIGS. 2A and 2B, any static current drawn by the analog circuitry is preferably added to the predetermined test limit(s) in order to generate realistic numbers. It should be noted that such circuitry may influence an I-V curve in a manner that resembles a defect, due to the fact that the static current consumed by analog circuitry may bear a linear relationship to supply voltage.

Because the shape of the I-V curves themselves are indicative of defects, predetermined test limit(s) in a method according to the present invention can be relaxed somewhat over typical test limits, such that the predetermined test limits only screen devices with gross defects. The predetermined test limits can be utilized with any or all of the power supply voltages for which a quiescent current measurement is taken.

Thus, a method has been described for improving the accuracy of quiescent current testing by reducing reliance on absolute quiescent current test limits. The device under test is examined at a number of supply voltage values, and the resulting I-V curve is examined to determine if its shape is indicative of a device having a defect of the type normally discovered via quiescent current testing. The invention thereby permits the quiescent current testing to be performed without absolute reliance on current limit values and without detracting from the reliability of the testing methodology.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A method for reducing transistor leakage currents in an integrated circuit to improve the accuracy of quiescent current testing, comprising:

applying a first power supply voltage to the integrated circuit;

placing the integrated circuit into a static DC state;

measuring a first quiescent current consumed by the integrated circuit at the first power supply voltage;

applying a second power supply voltage to the integrated circuit;

measuring a second quiescent current consumed by the integrated circuit at the second power supply voltage;

applying a third power supply voltage to the integrated circuit, the first, second and third power supply voltages having differing values;

measuring a third quiescent current consumed by the integrated circuit at the third power supply voltage; and examining the relative values of the first, second and third quiescent current values to determine the manner in which the quiescent current is changing with changing power supply voltage.

2. The method of claim 1, further comprising the step of:

rejecting the integrated circuit if the first, second and third quiescent current values bear an approximately linear relationship as determined by the step of examining the first, second and third quiescent current values.

3. The method of claim 1, further comprising the step of:

indicating that the integrated circuit is acceptable if the first, second and third quiescent current values bear an approximately exponential relationship as determined by the step of examining the first, second and third quiescent current values.

4. The method of claim 1, wherein the first power supply voltage is greater than the second power supply voltage and wherein the second power supply voltage is greater than the third power supply voltage.

5. The method of claim 4, wherein the first power supply voltage is approximately the nominal operating voltage of the integrated circuit.

6. The method of claim 4, wherein the step of examining the first, second and third quiescent current values further comprises:

subtracting the second quiescent current value from the first quiescent current value to produce a first delta current value;

subtracting the third quiescent current value from the first quiescent current value to produce a second delta current value; and performing a statistical curve-fitting operation on the first quiescent current value and the first and second delta current values.

7. The method of claim 6, wherein the step of examining the first, second and third quiescent current values further comprises:

rejecting the integrated circuit if the first quiescent current value and the first and second delta current values bear an approximately linear relationship as determined by the statistical curve-fitting operation.

8. The method of claim 6, wherein the step of examining the first, second and third quiescent current values further comprises:

indicating that the integrated circuit is acceptable if the first quiescent current value and the first and second delta current values bear an approximately exponential relationship as determined by the statistical curve-fitting operation.

9. The method of claim 6, wherein the step of examining the first, second and third quiescent current values is performed by automated testing equipment.

10. The method of claim 1, further comprising the steps of:

applying additional power supply voltage(s) to the integrated circuit; and measuring additional quiescent current(s) consumed by the integrated circuit at the additional power supply voltage(s), wherein the step of examining the first, second and third quiescent current values to determine if the integrated circuit is likely to have a defect further comprises examining the additional quiescent current(s).

11. The method of claim 1, further comprising the steps of:

comparing any of the first, second or third quiescent current values to a predetermined test limit; and rejecting the integrated circuit if the first, second or third quiescent current value exceeds the predetermined test limit.

12. The method of claim 1, wherein the integrated circuit is fabricated with a complementary metal-oxide-semiconductor process.

13. Automated test equipment for testing integrated circuits, the automated test equipment programmed to perform the steps of:

applying a first power supply voltage to an integrated circuit;

placing the integrated circuit into a static DC state;

measuring a first quiescent current consumed by the integrated circuit as the first power supply voltage;

applying a second power supply voltage to the integrated circuit;

measuring a second quiescent current consumed by the integrated circuit at the second power supply voltage;

applying a third power supply voltage to the integrated circuit, the first, second and third power supply voltages having differing values;

measuring a third quiescent current consumed by the integrated circuit at the third power supply voltage; and examining the relative values of the first, second and third quiescent current values to determine the manner in which the quiescent current is changing with changing power supply voltage.

14. The automated test equipment of claim 13, further programmed to reject the integrated circuit if the first, second and third quiescent current values bear an approximately linear relationship as determined by the step of examining the first, second and third quiescent current values.

15. The automated test equipment of claim 13, further programmed to indicate that the integrated circuit is acceptable if the first, second and third quiescent current values bear an approximately exponential relationship as determined by the step of examining the first, second and third quiescent current values.

16. The automated test equipment of claim 13, wherein the step of examining the first, second and third quiescent current values further comprises:

subtracting the second quiescent current value from the first quiescent current value to produce a first delta current value;

subtracting the third quiescent current value from the first quiescent current value to produce a second delta current value; and performing a statistical curve-fitting operation on the first quiescent current value and the first and second delta current values.

17. The automated test equipment of claim 16, wherein the step of examining the first, second and third quiescent current values further comprises:

rejecting the integrated circuit if the first quiescent current value and the first and second delta current values bear an approximately linear relationship as determined by the statistical curve-fitting operation.

18. The automated test equipment of claim 16, wherein the step of examining the first, second and third quiescent current values further comprises:

accepting the integrated circuit if the first quiescent current value and the first and second delta current values bear an approximately exponential relationship as determined by the statistical curve-fitting operation.

19. The automated test equipment of claim 13, further programmed to perform the steps of:

comparing any of the first, second or third quiescent current values to a predetermined test limit; and rejecting the integrated circuit if the first, second or third quiescent current value exceeds the predetermined test limit.

* * * * *